United States Patent
Chen et al.

(10) Patent No.: US 10,588,244 B2
(45) Date of Patent: Mar. 10, 2020

(54) TEMPERATURE REGULATED CABINET

(71) Applicant: DELTA ELECTRONICS, INC., Taoyuan County (TW)

(72) Inventors: Lee-Long Chen, Taoyuan County (TW); Chia-Wei Chen, Taoyuan County (TW); Jian-Jhang Wu, Taoyuan County (TW); Chun-Yang Hung, Taoyuan County (TW)

(73) Assignee: DELTA ELECTRONICS, INC., Taoyuan County (TW)

( * ) Notice: Subject to any disclaimer, the term of this patent is extended or adjusted under 35 U.S.C. 154(b) by 324 days.

(21) Appl. No.: 14/950,379

(22) Filed: Nov. 24, 2015

(65) Prior Publication Data

US 2016/0302326 A1 Oct. 13, 2016

(30) Foreign Application Priority Data

Apr. 13, 2015 (CN) .......................... 2015 1 0172000

(51) Int. Cl.
*H05K 7/20* (2006.01)

(52) U.S. Cl.
CPC ......... *H05K 7/207* (2013.01); *H05K 7/20554* (2013.01); *H05K 7/20609* (2013.01); *H05K 7/20618* (2013.01)

(58) Field of Classification Search
CPC .......... H05K 7/20554; H05K 7/20609; H05K 7/207; H05K 7/20618; H05K 7/202;

(Continued)

(56) References Cited

U.S. PATENT DOCUMENTS

| 4,386,651 A * | 6/1983 | Reinhard | H05K 7/206 165/104.33 |
| 4,658,593 A * | 4/1987 | Stenvinkel | F25D 29/00 62/126 |

(Continued)

FOREIGN PATENT DOCUMENTS

| CN | 101634477 B * | 1/2011 | ............ F24F 12/006 |
| WO | WO 2010/009626 | 1/2010 | |
| WO | WO-2010004727 A1 * | 1/2010 | .......... F24F 11/0001 |

OTHER PUBLICATIONS

Machine Translation of CN 101634477 B, Zhang, Jan. 2011.*
European Search Report dated Jun. 23, 2016 from corresponding application No. EP 16150981.5-1803.

*Primary Examiner* — Frantz F Jules
*Assistant Examiner* — Martha Tadesse
(74) *Attorney, Agent, or Firm* — Hauptman Ham, LLP

(57) ABSTRACT

A temperature-regulated cabinet (10) includes a cabinet body (1) and a temperature regulating module (2). The cabinet body (1) has a containing space (11) formed inside the cabinet body (1) and an opening (12) communicated with the containing space (11). The temperature regulating module (2) is detachably installed to the cabinet body (1) and covered onto the opening (12) and includes a temperature regulator (21), a first hood (22), a second hood (23) and an exhaust fan (24). The temperature regulator (21) has a casing (211). The first hood (22) is detachably installed to the top of the casing (211), and the second hood (23) is detachably installed to the bottom of the casing (211). The exhaust fan (24) is installed inside the first hood (22) or the second hood (23). The cabinet has the advantages of simplifying the production line and lowering the construction and operation costs.

10 Claims, 8 Drawing Sheets

(58) Field of Classification Search
CPC .............. H05K 7/206; H05K 7/20145; H05K 7/20736; Y02B 30/563; F24F 12/006
See application file for complete search history.

(56) References Cited

U.S. PATENT DOCUMENTS

| | | | | |
|---|---|---|---|---|
| 7,100,682 | B2* | 9/2006 | Okamoto | F28D 9/0068 165/104.33 |
| 2001/0033743 | A1* | 10/2001 | Kishita | F24H 9/2071 392/485 |
| 2001/0052412 | A1* | 12/2001 | Tikka | H05K 7/206 165/299 |
| 2005/0217299 | A1* | 10/2005 | Chu | F24F 13/222 62/259.2 |
| 2009/0056910 | A1* | 3/2009 | Mallia | H05K 7/20754 165/80.3 |
| 2012/0160448 | A1* | 6/2012 | Chen | H05K 7/20754 165/67 |
| 2012/0298330 | A1* | 11/2012 | Mysse, III | H05K 5/0213 165/96 |
| 2012/0298341 | A1* | 11/2012 | Fernandez | H04Q 1/025 165/121 |

* cited by examiner

TEMPERATURE REGULATED CABINET

FIELD OF THE INVENTION

The present invention relates to a cabinet or enclosure of information equipments, and more particularly to a temperature-regulated cabinet.

BACKGROUND OF THE INVENTION

In a traditional information equipment cabinet (or enclosure), electronic equipments and devices such as electronic communication equipments, power converters or backup batteries are put inside the cabinet, and most cabinets are made of metal with dustproof and waterproof functions for isolating the electronic equipments and devices contained in the cabinet from the outside and preventing dust and rainwater from entering into the cabinet, so as to achieve the effect of protecting the electronic equipments and devices contained in the cabinet.

In addition, the cabinet has a confined space formed therein. To dissipate the waste heat produced during the operation of the internal equipments, a fan or heat dissipating device is generally installed on the cabinet to maintain a low temperature and improve the stability and using life of the electronic devices. At present, the common ways to lower the air temperature inside the cabinet are described as follows. 1. External cool air is introduced into the cabinet directly. 2. A heat exchanger is used. 3. An air conditioner is used for dissipating the internal heat energy.

However, the aforementioned cabinet has the following drawbacks. 1. The air conditioner is generally used as a cooling device in tropical zones, and the fan is generally used in cold zones for ventilation and heat dissipation, so that manufacturers need to prepare several different types of heat dissipations for the cabinet and face the issues of complicated product line and high installation and operation costs. 2. If the fan, heat exchanger and air conditioner are integrated into the same cabinet, and one of the fans, heat exchangers and air conditioners is damaged, users have to send the whole cabinet to factory for maintenance. However, base stations are generally located at a remote place, and thus making the maintenance difficult and resulting in a long maintenance time.

In view of the aforementioned problems of the prior art, the inventor of the present invention invented the present invention to overcome the problems of the prior art.

SUMMARY OF THE INVENTION

Therefore, it is a primary objective of the present invention to provide a temperature-regulated cabinet that integrates a temperature regulator, a fan, and/or other heat dissipating devices into the same cabinet body, and the temperature regulator, fan, or any other heat dissipating device is selected according to the external ambient temperature to adjust the internal temperature of the cabinet body, so as to achieve the effects of simplifying the production line and lower the installation and operation costs. In addition, the cabinet body, the temperature regulator, a first hood, and a second hood may be assembled together or detached from one another, so that when the standalone temperature regulator, first hood, and second hood breaks down, such components can be removed quickly to reduce the maintenance procedure and time, so as to maintain a continuous stable operation of the base station.

To achieve the aforementioned and other objectives, the present invention provides a temperature-regulated cabinet, comprising: a cabinet body, having a containing space formed therein, and an opening communicated with the containing space; and a temperature regulating module, detachably installed onto the cabinet body, and configured to be corresponsive to the opening to cover the opening, and the temperature regulating module further comprising: a temperature regulator, having a casing, and an air outlet and an air inlet configured to be corresponsive to the containing space; a first hood, detachably installed to the top of the casing, and having a plurality of first vents and a plurality of second vents, and the first vents being configured to be corresponsive to the containing space, and the second vents being exposed to the outside from the first hood; a second hood, detachably installed to the bottom of the casing, and having a third vent and a plurality of fourth vents, and the third vent being configured to be corresponsive to the containing space, and the fourth vents being exposed to the outside from the second hood; and at least one exhaust fan, installed inside the first hood or the second hood.

The present invention has the following effects:

1. The temperature-regulated cabinet of the present invention comprises microcomputer controlled components including a first sensor, a second sensor, a third sensor and a controller, wherein the controller is provided for computing the temperature inside/outside a cabinet body and selecting the most appropriate operation mode for heat dissipation according to the ambient temperature to save the power consumption for the operation of a base station.

2. The temperature-regulated cabinet further comprises a suction fan which is turned on or off with an exhaust fan to improve the external airflow circulation efficiency of the temperature-regulated cabinet.

DESCRIPTION OF THE PREFERRED EMBODIMENTS

The technical contents of the present invention will become apparent with the detailed description of preferred embodiments accompanied with the illustration of related drawings as follows.

With reference to FIGS. 1 to 7 for a temperature-regulated cabinet of the present invention, the temperature-regulated cabinet comprises a cabinet body 1 and a temperature regulating module 2.

Figure 1:
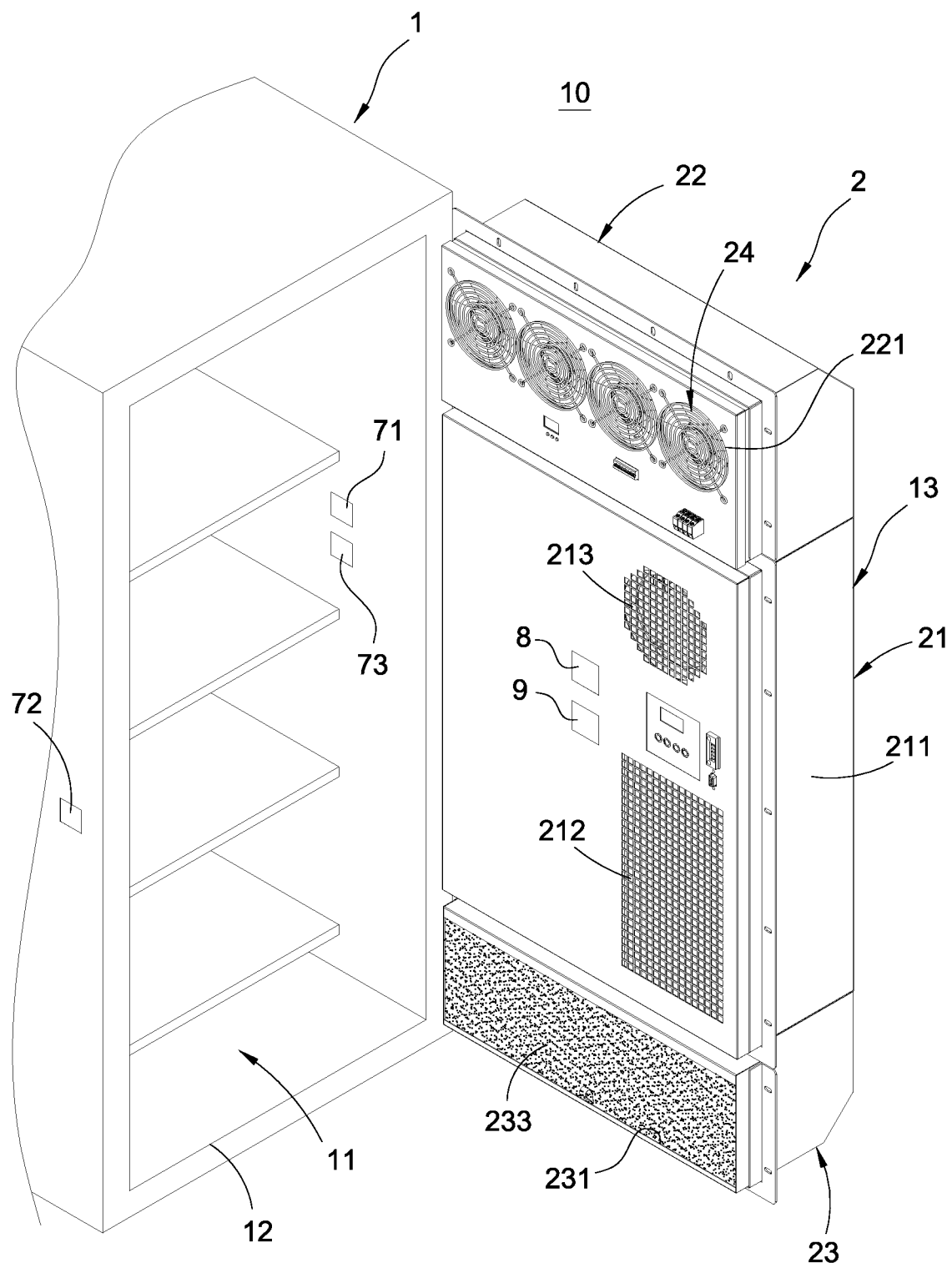
FIG. 1 is a perspective view of a temperature-regulated cabinet of the present invention.
Figure 2:
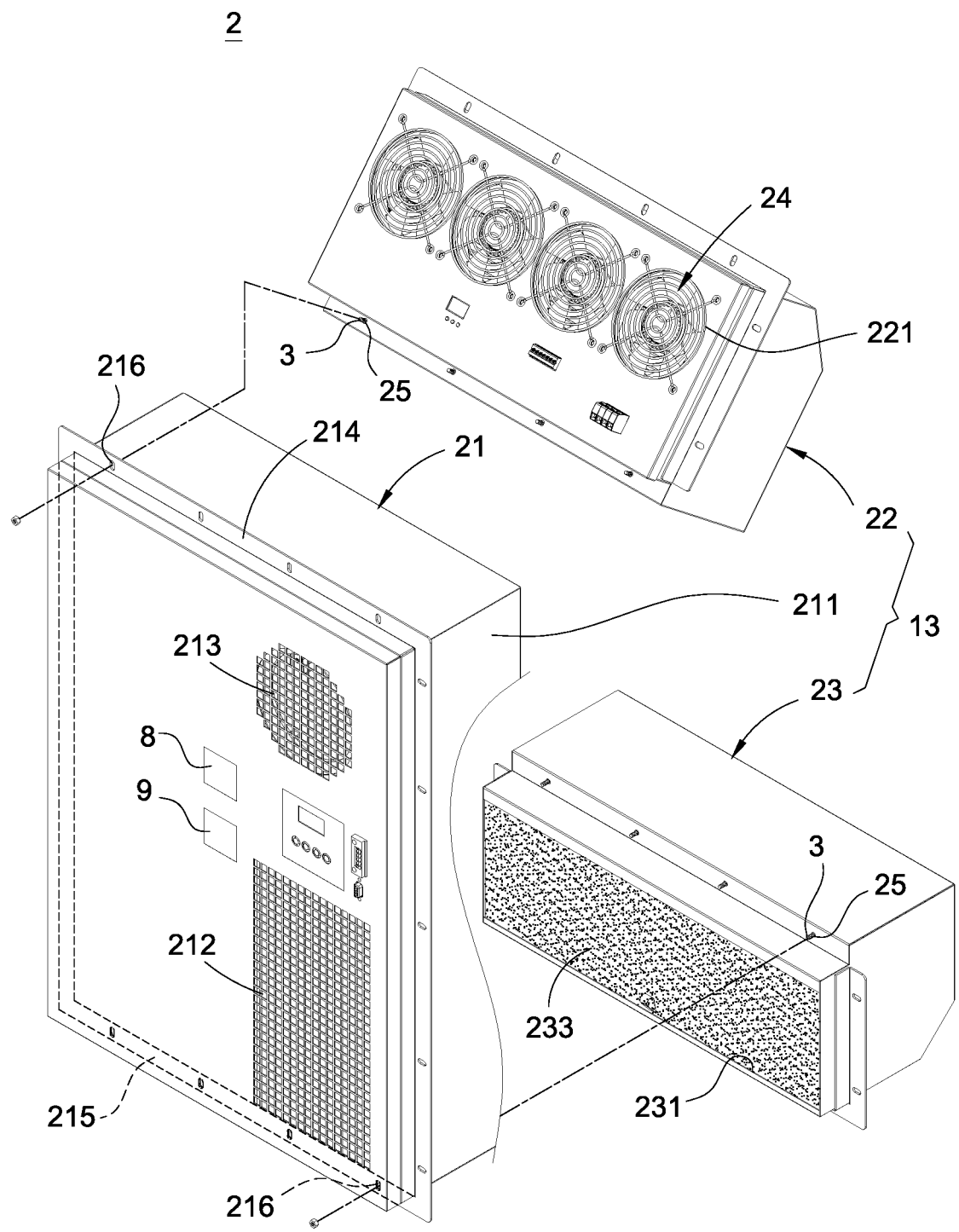
FIG. 2 is an exploded view of a temperature-regulated cabinet of the present invention.
Figure 3:
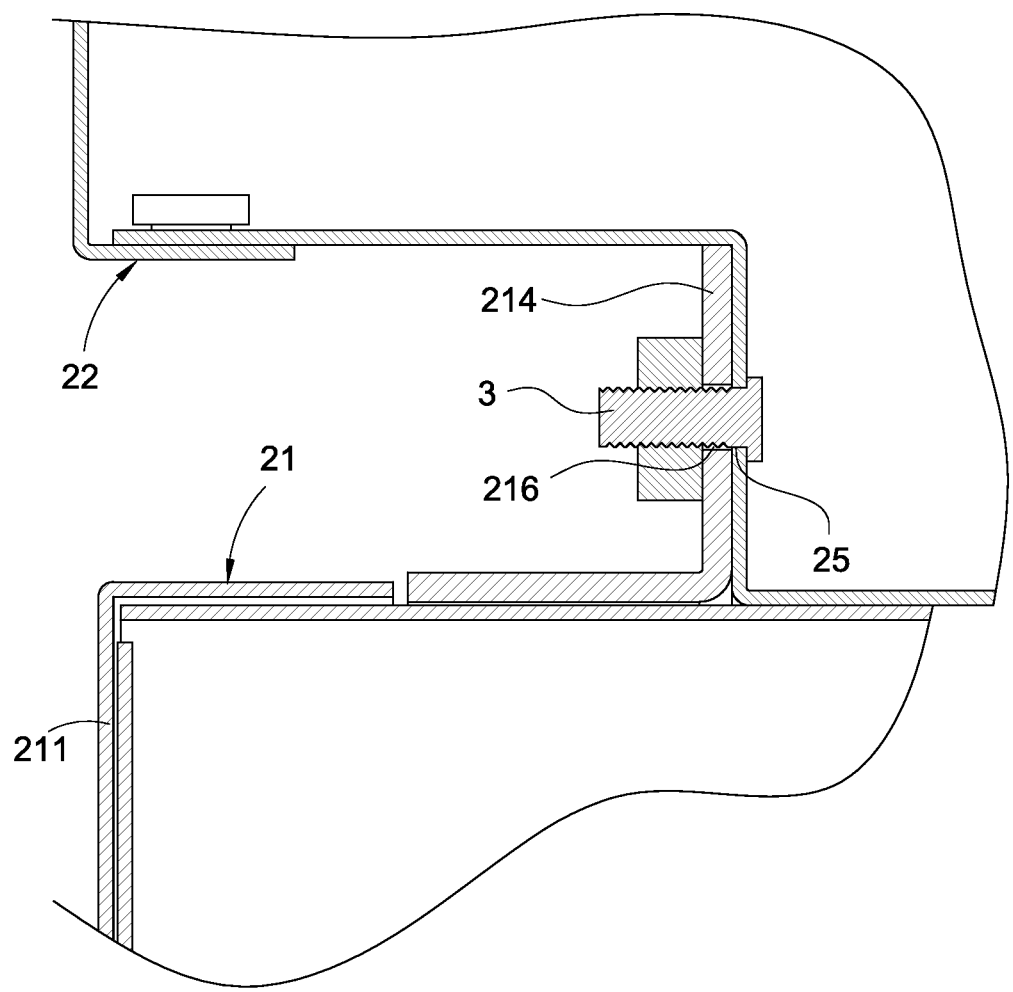
FIG. 3 is a partial cross-sectional view of a temperature-regulated cabinet of the present invention.
Figure 4:
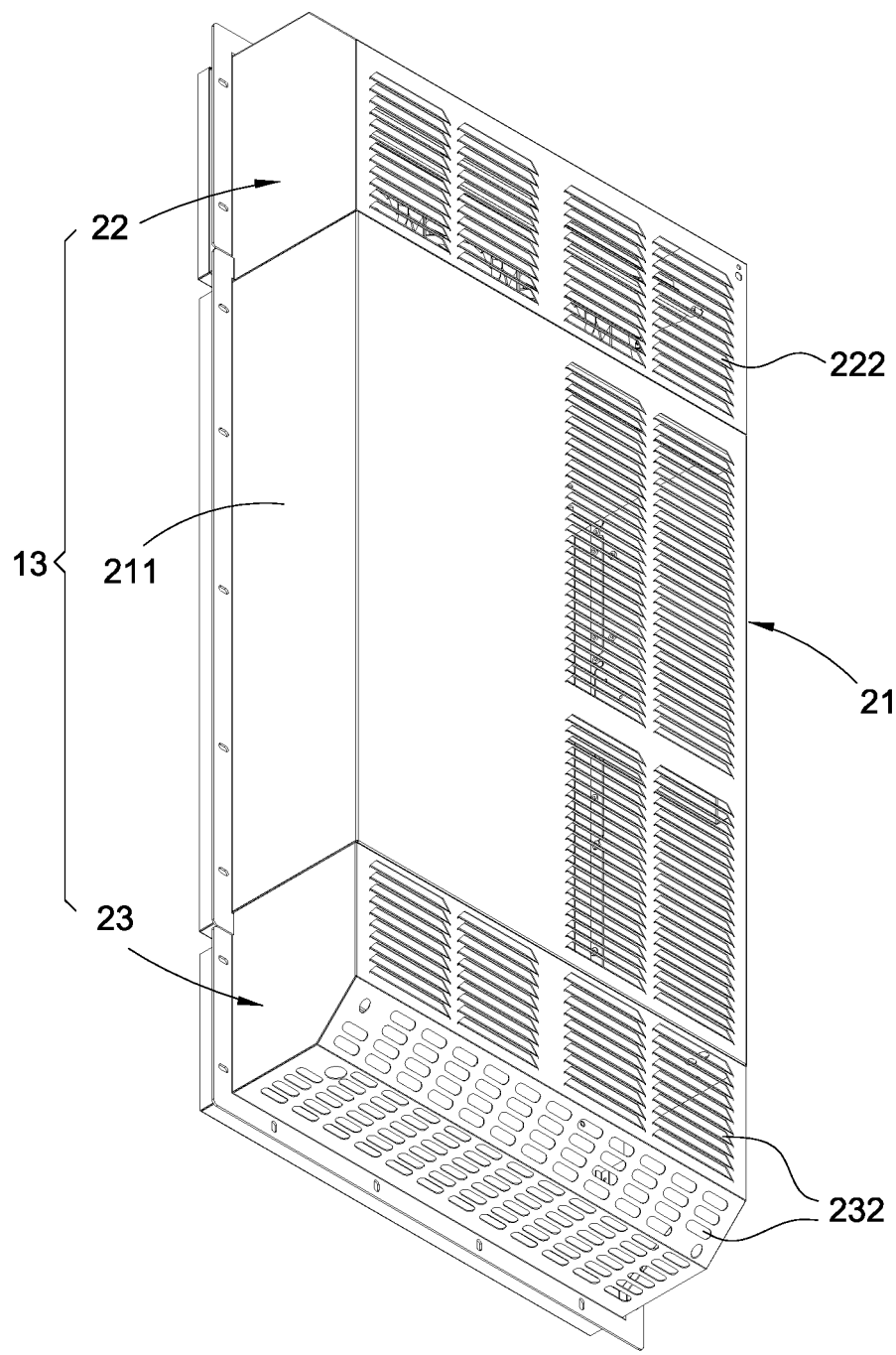
FIG. 4 is another exploded view of a temperature-regulated cabinet of the present invention.

In FIG. 1, the cabinet body 1 may be a cold air conditioner, a hot air conditioner, a cold/hot air conditioner or a heat exchanger. The cabinet body 1 has a containing space 11 formed therein, and an opening 12 formed thereon and communicated with the containing space 11.

In FIGS. 1 to 7, the temperature regulating module 2 is detachably installed to the cabinet body 1 and covered onto the opening 12, and the temperature regulating module 2 comprises a temperature regulator 21, a first hood 22, a second hood 23 and one or more exhaust fans 24.

The temperature regulator 21 comprises: a casing 211; an air outlet 212 and an air inlet 213, both configured to be corresponsive to the containing space 11; an upper protruding plate 214 and a lower protruding plate 215, both extended from the casing 211 and both having a plurality of first fixing holes 216 respectively.

The first hood 22 is detachably installed to the top of the casing 211, and the first hood 22 has a plurality of first vents 221 and a plurality of second vents 222, and each first vent 221 is configured to be corresponsive to the containing space 11, and each second vent 222 is exposed from the first hood 22 to the outside, and the first hood 22 has a plurality of second fixing holes 25.

The second hood 23 is detachably installed to the bottom of the casing 211, and the second hood 23 has a third vent 231 and a plurality of fourth vents 232, and the third vent 231 is configured to be corresponsive to the containing space 11, and each fourth vent 232 is exposed from the second hood 23 to the outside, and the second hood 23 has a plurality of second fixing holes 25.

In addition, the second hood 23 includes a filter 233 installed thereon, covered onto the corresponding third vent 231, and provided for filtering the airflow flowing into the cabinet body 1. A portion of the fourth vent 232 is formed at the bottom of the second hood 23, and a flap 234 is fixed to the interior of the second hood 23, configured to be corresponsive to the fourth vent 232 formed at the bottom of the second hood 23, and provided for blocking rainwater from entering into the fourth vent 232 to prevent the rainwater entering into the cabinet body 1 through the fourth vent 232 and the third vent 231.

The exhaust fan 24 may be installed inside one of the first hood 22 and the second hood 23. In this preferred embodiment, there are plural exhaust fans 24, and each exhaust fan 24 is installed at each first vent 221 of the first hood 22, and each exhaust fan 24 has an exhaust port 241, and the exhaust ports 241 are configured to be corresponsive to the second vents 222 respectively.

In FIGS. 1 to 4, the temperature-regulated cabinet 10 of the present invention further comprises a plurality of locking elements 3, each passing through and being fixed to each respective first fixing hole 216 and each respective second fixing hole 25, so that the casing 211, the first hood 22 and the second hood 23 may be assembled and coupled altogether.

In a preferred embodiment of the present invention, the casing 211, the first hood 22 and the second hood 23 are jointly assembled into a door 13, and the door 13 is pivotally coupled to cabinet body 1 and covered onto the opening 12. Wherein, the casing 211, the first hood 22 and the second hood 23 are jointly assembled into one of the side boards of the cabinet body 1, but the invention is not limited to this preferred embodiment only.

Figure 5:
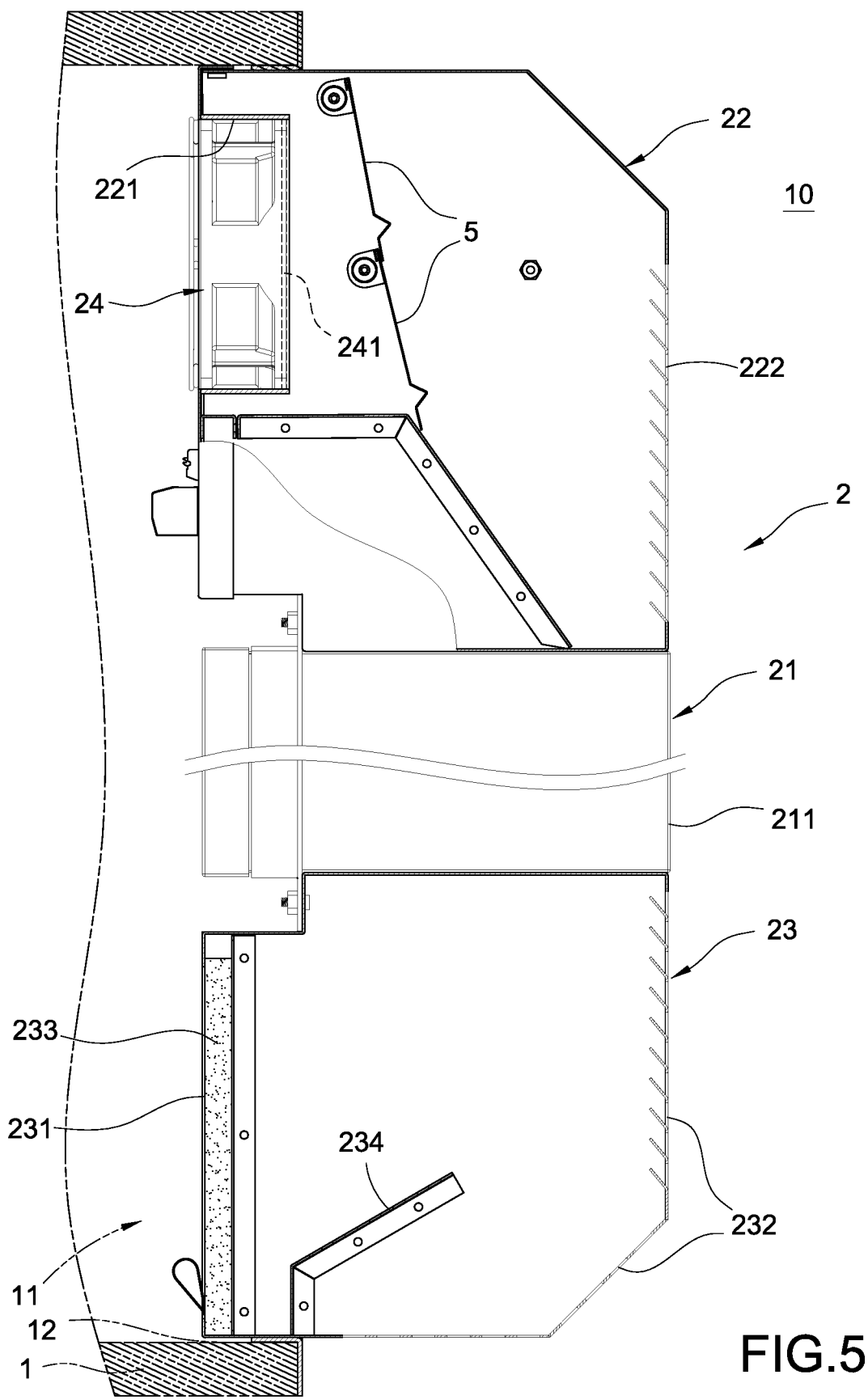
FIG. 5 is a schematic view of a using status of a temperature-regulated cabinet of the present invention.
Figure 6:
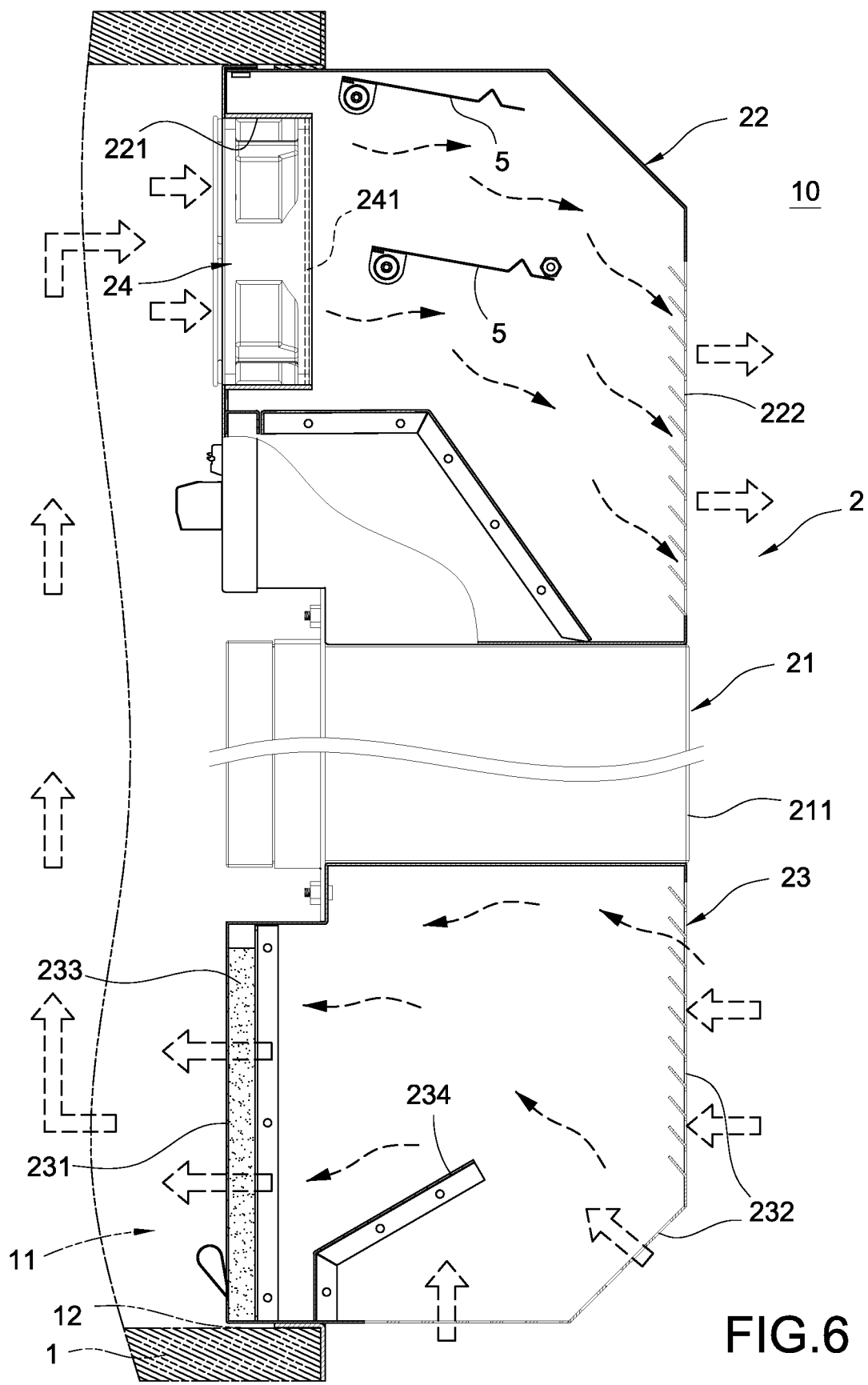
FIG. 6 is a schematic view of another using status of a temperature-regulated cabinet of the present invention.

In FIGS. 5 and 6, the temperature-regulated cabinet 10 of the present invention further comprises one or more moving boards 5, and the moving board 5 is pivotally coupled to the interior of the first hood 22, disposed between the exhaust port 241 and each second vent 222, and covered onto the corresponding exhaust fan 24.

In FIG. 1, the temperature-regulated cabinet 10 of the present invention further comprises a first sensor 71, a second sensor 72, a third sensor 73, a controller 8 and an alarm 9.

The first sensor 71 is installed in the containing space 11 for sensing a temperature change in the space 11 to output an electrical signal, and the controller 8 is electrically coupled to the first sensor 71 for receiving the electrical signal to selectively turn on a temperature regulator 21 and an exhaust fan 24.

The second sensor 72 is installed outside the cabinet body 1 for sensing a temperature change of the external air to output an electrical signal, and the controller 8 is electrically coupled to the second sensor 72 for receiving the electrical signal to selectively turn on a temperature regulator 21 and an exhaust fan 24.

The third sensor 73 is installed in the containing space 11 for sensing a too-high temperature or a too-low temperature in the space 11 to output an electrical signal, and the alarm 9 is electrically coupled to the third sensor 73 for issuing an alarm upon the receipt of the electrical signal and sending out a failure signal to notify maintenance personnel to come over and handle the situation.

With reference to FIGS. 1 to 4 for a temperature-regulated cabinet 10 of the present invention, the cabinet body 1 has a containing space 11 formed therein and an opening 12 communicated with the containing space 11. The temperature regulating module 2 is detachably coupled to cabinet body 1 and covered onto the corresponding opening 12, and the temperature regulator 21 comprises: a casing 211; an air outlet 212 and an air inlet 213, configured to be corresponsive to the containing space 11; a first hood 22, detachably installed to the top of the casing 211, and having a first vent 221 and a second vent 222, and the first vent 221 being configured to be corresponsive to the containing space 11, and the second vent 222 being exposed from the first hood 22 to the outside; an second hood 23, detachably installed to the bottom of the casing 211, and having a third vent 231 and a fourth vent 232, and the third vent 231 being configured to be corresponsive to the containing space 11, and the fourth vent 232 being exposed from the second hood 23 to the outside; and an exhaust fan 24 installed inside one of the first hood 22 and the second hood 23. The temperature regulator 21 and the fan 24 are integrated into the same cabinet body 1, so that the temperature-regulated cabinet 10 may select the temperature regulator 21 or the fan 24 to adjust the temperature inside the cabinet body 1 according to the external ambient temperature, so as to achieve the effects of simplifying the production line and lowering the installation and operation costs.

Figure 7:
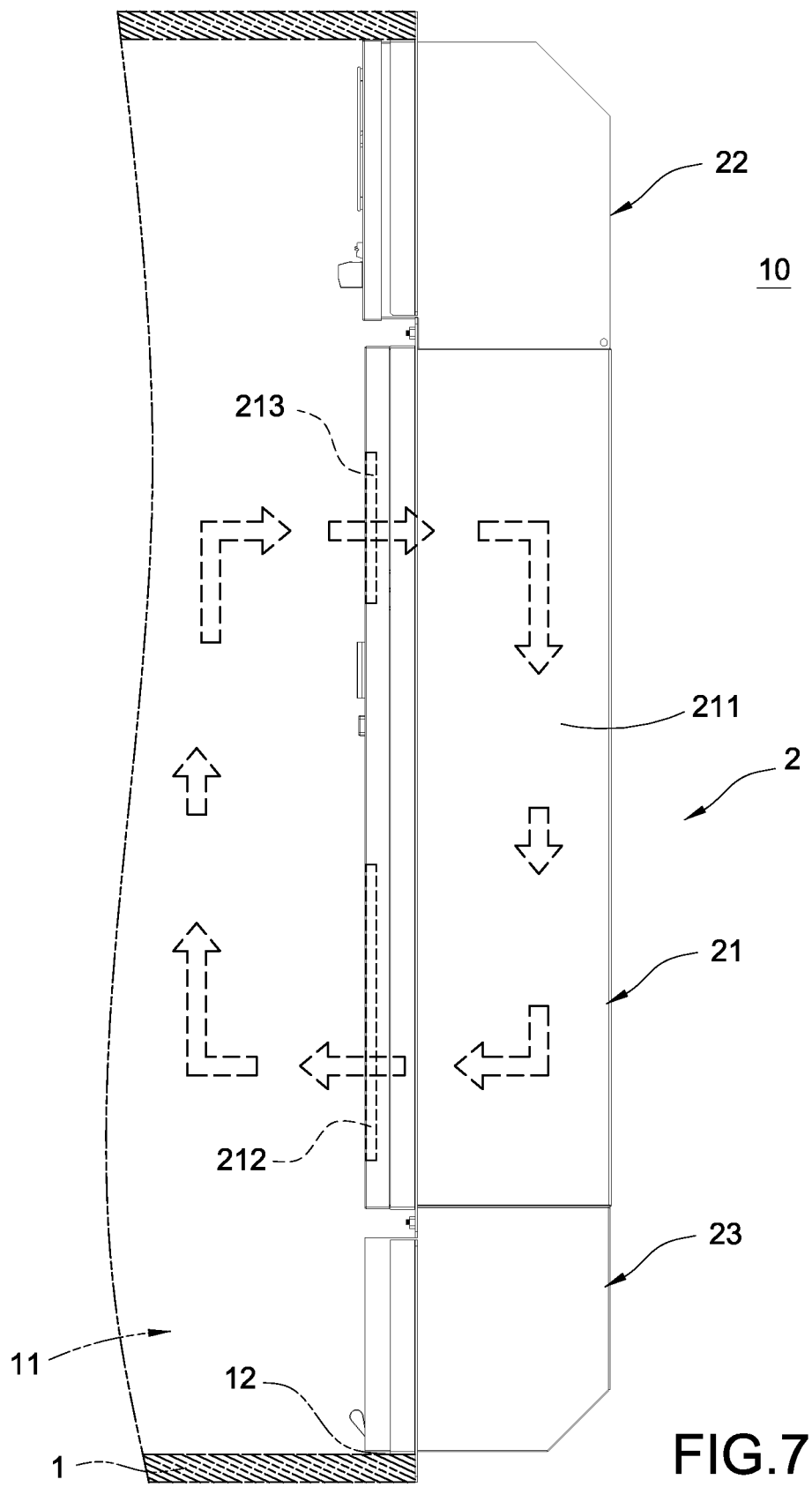
FIG. 7 is a schematic view of a further using status of a temperature-regulated cabinet of the present invention.

With reference to FIGS. 5 to 7 for the using statuses of the temperature-regulated cabinet 10 of the present invention, the temperature regulator 21 and the fan 24 are integrated into the same cabinet body 1, so that a base station may choose an air conditioner as a cooling device in a tropical zone, and a fan for ventilation and heat dissipation in a cold zone, and the temperature-regulated cabinet 10 may select a temperature regulator 21 or a fan 24 to adjust the temperature inside the cabinet body 1 according to the external ambient temperature, so as to achieve the effects of simplifying the production line and lowering the installation and operation costs.

In FIGS. 1 and 6, the first sensor 71 is installed in the containing space 11 for sensing the temperature inside the containing space 11. If the sensed temperature is normal, the exhaust fan 24 will be turned on after the controller 8 has received an electrical signal. In FIGS. 1 and 7, the first sensor 71 is installed in the containing space 11 for sensing the temperature inside the containing space 11. If the sensed temperature is too high, the controller 8 has received an electrical signal after the electrical signal is outputted and, the temperature regulator 21 will turn on the air conditioner. In FIGS. 1 and 7, the first sensor 71 is installed in the containing space 11 for sensing the temperature inside the containing space 11. If the sensed temperature is too low, and an electrical signal is outputted, the controller 8 will drive the temperature regulator 21 to turn on the hot air conditioner after receiving the electrical signal.

In FIGS. 1 and 6, the second sensor 72 is installed outside the cabinet body 1 for sensing the external air temperature. If the sensed external air temperature is too low and an electrical signal is outputted, the controller 8 will turn on the exhaust fan 24 after receiving the electrical signal. In FIGS. 1 and 7, the second sensor 72 is installed outside the cabinet body 1 for sensing an external air temperature. If the sensed external air temperature is too high, the controller 8 will drive the temperature regulator 21 to turn on the cold air conditioner after receiving the electrical signal. In FIGS. 1 and 7, the second sensor 72 is installed outside the cabinet body 1 for sensing an external air temperature. If the sensed external air temperature is too low, and an electrical signal is outputted, the controller 8 will drive the temperature regulator 21 to turn on the hot air conditioner after receiving the electrical signal.

In summation, the temperature-regulated cabinet 10 of the present invention includes microcomputer controlled components such as a first sensor 71, a second sensor 72, a third sensor 73 and a controller 8, wherein the controller 8 is provided for computing the temperature inside/outside the cabinet body 1 and automatically select the most appropriate operation mode for the heat dissipation according to the difference between the internal temperature and the external ambient temperature. In summer or a too-hot environment, the temperature regulator 21 will be turned on to provide sufficient cold air to maintain a low temperature inside the cabinet. In autumn, winter, or a too-cold environment, a fan 24 operated in ventilation and cooling modes dissipate the high-temperature heat from the cabinet to the outside, so as to save the power consumption for the operation of the base station.

In FIGS. 1 to 4, the temperature-regulated cabinet 10 of the present invention further comprises a plurality of locking elements 3, and an upper protruding plate 214 and a lower protruding plate 215 extended from the casing 211 and having a plurality of first fixing holes 216 respectively, and the first hood 22 and the second hood 23 include a plurality of second fixing holes 25 respectively, and each locking element 3 is passed and fixed to each respective first fixing hole 216 and each respective second fixing hole 25, so that the casing 211, the first hood 22 and the second hood 23 jointly form a door 13, and the door 13 is pivotally coupled to the cabinet body 1 and covered onto the corresponding opening 12. The cabinet body 1, the temperature regulator 21, the first hood 22 and the second hood 23 may be assembled as a whole or detachably coupled to one another, so that if the standalone temperature regulator 21, first hood 22, or second hood 23 breaks down, a new one can be removed and replaced quickly, and the present invention can reduce the maintenance procedure and time of the temperature-regulated cabinet 10 effectively to maintain a continuous stable operation of a base station.

In FIGS. 5 and 6, the temperature-regulated cabinet 10 further comprises a moving board 5 installed between the exhaust port 241 and each second vent 222 and covered onto the corresponding exhaust fan 24. If the exhaust fan 24 is turned off, the moving board 5 will cover the second vent 222 to maintain an internal circulation of the airflow inside the cabinet body 1. If the exhaust fan 24 is turned on, the moving board 5 will be blown and lifted by the airflow of the exhaust port 241, so that the airflow inside the cabinet body 1 may have an external circulation situation.

Figure 8:
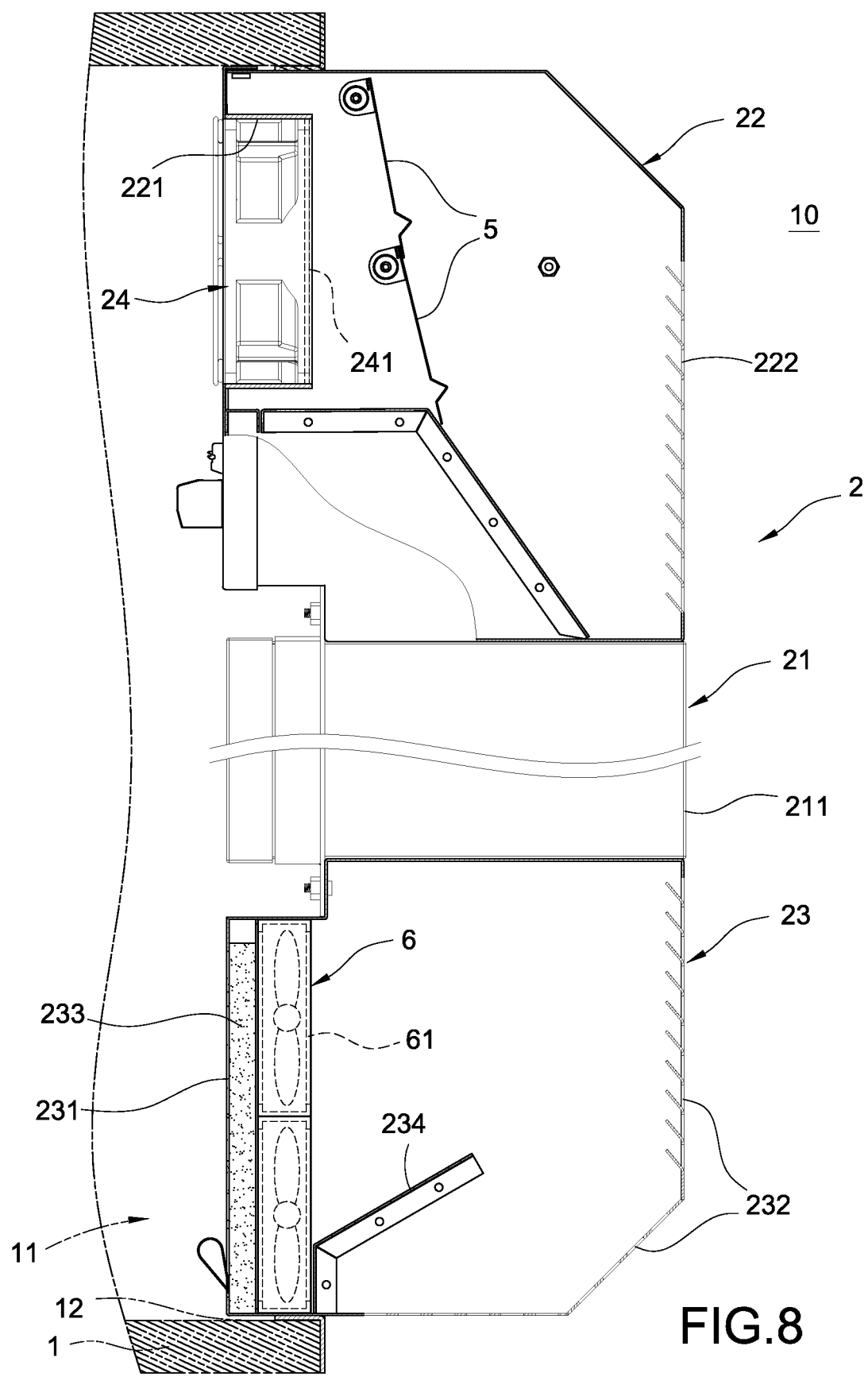
FIG. 8 is a schematic view of a using status of a temperature-regulated cabinet in accordance with another preferred embodiment of the present invention.

With reference to FIG. 8 for a temperature-regulated cabinet 10 in accordance with another preferred embodiment of the present invention, this embodiment is substantially the same as the embodiments as shown in FIGS. 1 to 7 except that the temperature-regulated cabinet 10 of this embodiment further comprises one or more suction fans 6.

Further, the suction fan 6 is installed at the third vent 231, and the suction fan 6 has an air suction port 61 configured to be corresponsive to each fourth vent 232, so that external air may be drawn into the cabinet body 1 by the suction fan 6, and the suction fan 6 may be turned on or off together with the exhaust fan 24 to improve the external airflow circulation efficiency of the temperature-regulated cabinet 10.

In summation of the description above, the temperature-regulated cabinet of the present invention is novel, useful and inventive and complies with the patent application requirements and thus is duly filed for patent application. While the invention has been described by means of specific embodiments, numerous modifications and variations could be made thereto by those skilled in the art without departing from the scope and spirit of the invention set forth in the claims.

What is claimed is:

1. A cabinet, comprising: a cabinet body (1), having a containing space (11) formed therein, and an opening (12) communicated with the containing space (11); and a temperature regulating module (2), detachably installed onto the cabinet body (1), and configured to be corresponsive to the opening (12) to cover the opening (12), and the temperature regulating module (2) further comprising: a temperature regulator (21), having a casing (211), and an air outlet (212) and an air inlet (213) configured to be corresponsive to the containing space (11), and an upper protruding plate (214) and a lower protruding plate (215) extended from the casing (211), and the upper protruding plate (214) and the lower protruding plate (215) having a plurality of first fixing holes (216) respectively; a first hood (22), detachably installed to a top of the casing (211), and having a plurality of first vents (221) and a plurality of second vents (222), and the first vents (221) being configured to be corresponsive to the containing space (11), and the second vents (222) being exposed to an outside from the first hood (22), a first L-shaped recess being defined on a bottom of the first hood (22) in a side view; a second hood (23), detachably installed to a bottom of the casing (211), and having a third vent (231) and a plurality of fourth vents (232), and the third vent (231) being configured to be corresponsive to the containing space (11), and the fourth vents (232) being exposed to an outside from the second hood (23), a second L-shaped recess being defined on a top of the second hood (23) in the side view, and the first L-shaped recess of the first hood (22) and the second L-shaped recess of the second hood (23) having a plurality of second fixing holes (25) respectively; and at least one exhaust fan (24), installed inside the first hood (22) or the second hood (23); a plurality of locking elements (3), the upper protruding plate (214) being accommodated in the first L-shaped recess of the first hood (22), the lower protruding plate (215) being accommodated in the second L-shaped recess of the second hood (23), each of the plurality of locking elements (3) being passed and fixed to each respective of the plurality of first fixing holes (216) and each respective of the plurality of second fixing holes (25), the casing (211), the first hood (22) and the second hood (23) jointly form a door (13), and the door (13) is pivotally coupled to the cabinet body (1) and configured to be corresponsive to the opening (12) to cover the opening (12), wherein when the plurality of locking elements (3) are released from the plurality of first fixing holes (216) and the plurality of second fixing holes (25), the first hood (22) and the second hood (23) are driven by the plurality of locking elements (3) and thereby detached from the casing (211), and the exhaust fan (24) is detached from the casing (211) with one of the first hood (22) and the second hood (23).

2. The cabinet as claimed in claim 1, wherein the exhaust fan (24) is installed at the first vents (221), and the exhaust fan (24) has an exhaust port (241) configured to be corresponsive to the second vents (222).

3. The cabinet as claimed in claim 2, further comprising at least one moving board (5), and the at least one moving board (5) is pivotally coupled to an interior of the first hood (22) and installed between the exhaust port (241) and the second vents (222), and the moving board (5) is configured to be corresponsive to the exhaust fan (24) to cover the exhaust fan (24).

4. The cabinet as claimed in claim 2, further comprising at least one suction fan (6) installed at the third vent (231), and the suction fan (6) has an air suction port (61) configured to be corresponsive to the fourth vents (232).

5. The cabinet as claimed in claim 1, wherein the second hood (23) has a filter (233) installed therein and configured to be corresponsive to the third vent (231) to cover the third vent (231).

6. The cabinet as claimed in claim 1, wherein the fourth vents (232) are formed at a bottom of the second hood (23), and the second hood (23) has a flap (234) fixed therein and configured to be corresponsive to the fourth vents (232).

7. The cabinet as claimed in claim 1, wherein the temperature regulator (21) is a cold air conditioner, a hot air conditioner, a cold/hot air conditioner, or a heat exchanger.

8. The cabinet as claimed in claim 1, further comprising a first sensor (71) and a controller (8), and the first sensor (71) being installed in the containing space (11) for sensing a temperature change in the containing space (11) to output an electrical signal, and the controller (8) being electrically coupled to the first sensor (71) for receiving the electrical signal to selectively turn on the temperature regulator (21) and the exhaust fan (24).

9. The cabinet as claimed in claim 1, further comprising a second sensor (72) and a controller (8), and the second sensor (72) being installed outside the cabinet body (1) for sensing a temperature change of the external air to output an electrical signal, and the controller (8) being electrically coupled to the second sensor (72) for receiving the electrical signal to selectively turn on the temperature regulator (21) and the exhaust fan (24).

10. The cabinet as claimed in claim 1, further comprising a third sensor (73) and an alarm (9), and the third sensor (73) being installed in the containing space (11) for sensing a temperature change in the containing space (11) to output an electrical signal, and the alarm (9) being electrically coupled to the third sensor (73) for receiving the electrical signal and turned on after the electrical signal is received.

* * * * *